(12) United States Patent
Hattori et al.

(10) Patent No.: US 6,172,295 B1
(45) Date of Patent: *Jan. 9, 2001

(54) SOLAR BATTERY MODULE AND METHOD FOR ASSEMBLING THE SAME

(75) Inventors: Yoshiya Hattori, Kyoto; Shunsuke Fukatsu, Nakakoma-gun, both of (JP)

(73) Assignee: Sunster Giken Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 09/011,661

(22) PCT Filed: Aug. 12, 1996

(86) PCT No.: PCT/JP96/02275
  § 371 Date: Feb. 13, 1998
  § 102(e) Date: Feb. 13, 1998

(87) PCT Pub. No.: WO97/07549
  PCT Pub. Date: Feb. 27, 1997

(30) Foreign Application Priority Data

Aug. 14, 1995 (JP) ................................................ 7-206955

(51) Int. Cl.⁷ ...................... H01L 31/0203; H01L 31/048
(52) U.S. Cl. ............................ 136/251; 136/244; 136/259
(58) Field of Search .................................. 136/244, 251, 136/259; 156/303.1, 331.4; 429/111

(56) References Cited

U.S. PATENT DOCUMENTS

| | | | |
|---|---|---|---|
| 4,231,807 | * 11/1980 | Keeling et al. | 136/251 |
| 4,239,555 | * 12/1980 | Scharlack et al. | 136/251 |
| 4,249,958 | * 2/1981 | Baudin et al. | 136/251 |
| 4,633,032 | * 12/1986 | Oido et al. | 136/251 |
| 4,692,557 | * 9/1987 | Samuelson et al. | 136/251 |
| 4,830,038 | * 5/1989 | Anderson et al. | 136/251 |
| 4,847,669 | * 7/1989 | Yamazaki et al. | 357/30 |
| 5,460,660 | * 10/1995 | Albright et al. | 136/251 |
| 5,470,396 | * 11/1995 | Mongon et al. | 136/251 |
| 5,476,553 | * 12/1995 | Hanoka et al. | 136/251 |
| 5,578,142 | * 11/1996 | Hattori et al. | 136/251 |
| 5,725,006 | * 3/1998 | Kawama et al. | 136/251 |

FOREIGN PATENT DOCUMENTS

| | | | |
|---|---|---|---|
| 4-71276 | 3/1992 | (JP) . | |
| 4-130457 | 11/1992 | (JP) . | |
| 5-51560 | * 2/1993 | (JP) | C09J/4/06 |
| 5-51560 | 3/1993 | (JP) . | |

* cited by examiner

Primary Examiner—Ellis Robinson
Assistant Examiner—Michael C. Miggins
(74) Attorney, Agent, or Firm—Jacobson, Price, Holman & Stern, PLLC

(57) ABSTRACT

A high-quality solar battery module having an excellent adhesive property, weathering resistance, and reliability of battery function and a method of assembling the same are disclosed. The solar battery module is constituted of a solar cell panel provided with solar cell elements arranged on the back said of a transmitting panel opposite to the light-receiving surface of the light-transmitting panel; and a frame provided with plate or flange projecting therefrom and arranged over the entire periphery of the panel in order to support the back side of the light-transmitting panel and keeps the light-receiving surface in open. The solar cell panel is bonded to the projecting plate of the frame with a moisture curing hot-melt adhesive composed mainly of a polymer containing at least two hydrolytic silyl group in one molecule.

2 Claims, 3 Drawing Sheets

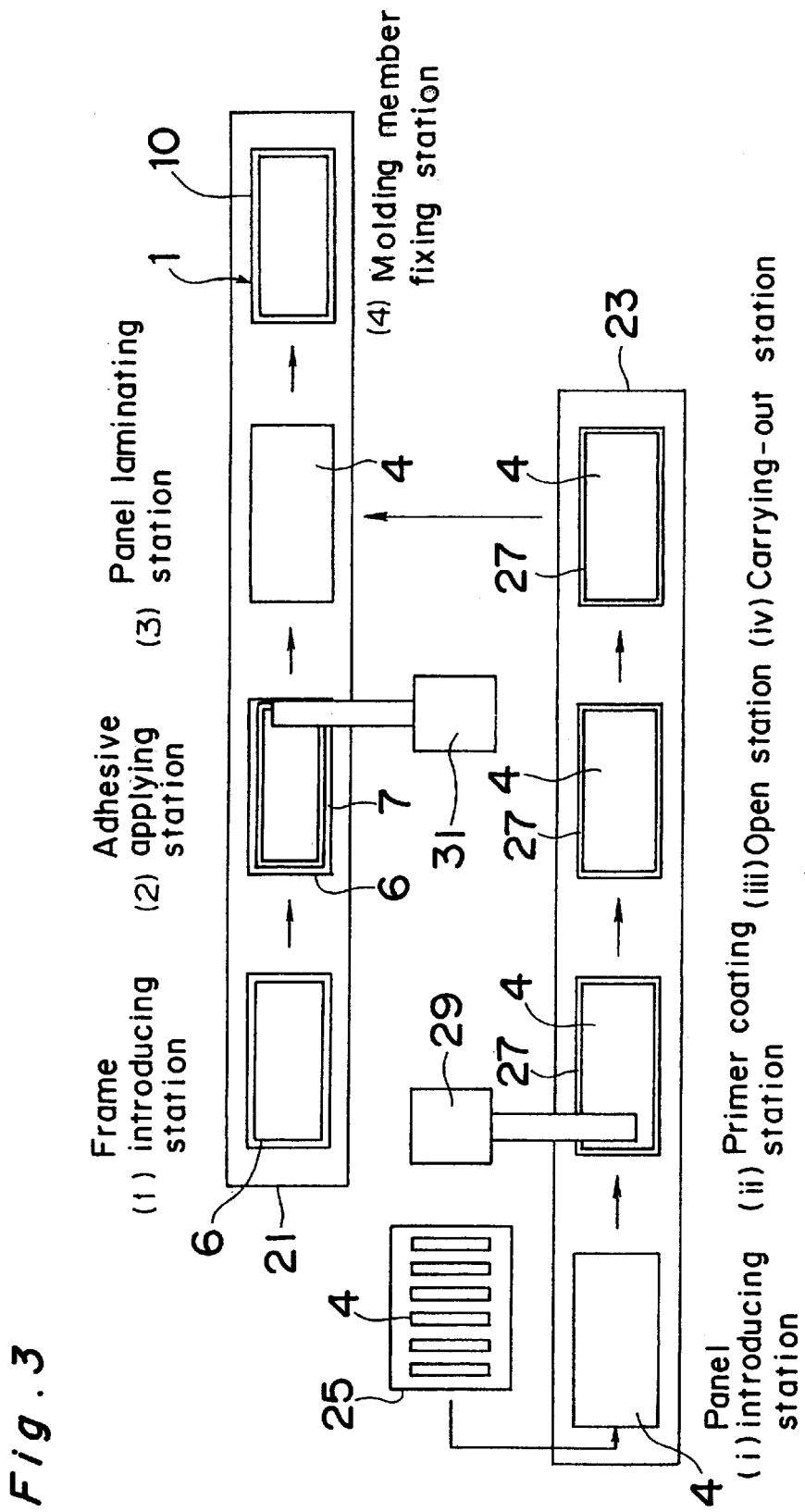

SOLAR BATTERY MODULE AND METHOD FOR ASSEMBLING THE SAME

TECHNICAL FIELD

The present invention relates to a solar battery module and a process for assembling the same. More particularly, it relates to a solar battery module comprising a solar battery panel and a suitable frame, the solar battery being fixed to the frame, which is capable of bonding without using a primer necessarily because a specific moisture curing hot-melt adhesive is used as a fixing adhesive, and is superior in durability such as weathering resistance, etc. as well as reliability of battery functions and quality, and a process for producing the same, which is capable of operating simply and rapidly.

BACKGROUND TECHNIQUE

Recently, utilization of a solar battery has become of major interest in view of protection of the global environment. This solar battery as a module is exclusively arranged outside and such a solar battery module is generally composed of a solar battery panel comprising a light-transmission panel and a solar battery element, the solar battery element being provided on the surface which is opposed to the light-receiving surface of the light-transmission plate, and a frame for fixing the solar battery panel thereon. As the fixing frame, for example, there has been widely used a frame having four frame bodies capable of fitting in four directions to the peripheral end portion of the solar battery panel. In this case, there is a problem that the frame should be constructed by fitting four frame bodies into each end portion of the solar battery panel and fixing them each other by means of fixing such as screw, etc. and therefore it takes a long time to assemble them.

Although a sealing material is interposed to fix the solar battery panel onto the frame body, scatter in thickness of the sealing material can cause distortion of the outside dimension of the frame and finally whole solar battery module.

On the other hand, as the sealing material, a butyl rubber is used because of its water shielding characteristic (amount of steam transmitted is comparatively small). However, the butyl rubber is sometimes soften by heat, for example, the butyl rubber causes softening flow at high temperature under a load, for example when the packaged solar battery module is transported to tropics and the panel sometimes settles by its own weight. Therefore, two typical methods are used; one is a method of preventing the panel from settling by filling an elastic member into the gap portion between the lower surface of the panel and the frame body in close vicinity to the butyl rubber sealing material (see Japanese Utility Model Kokai Publication No. 3-10560) and the other is a method of using a silicone sealing material in combination with the butyl rubber sealing material to improve the weathering resistance and heat resistance (see Japanese Utility Model Kokai Publication No. 4-130457). However, even in case of the former method of filling the elastic member, the butyl rubber sealing material is still softened and exposed from the frame to deteriorate the appearance, which results in penetration of rainwater. Thus, the battery functions are inhibited. In case of the latter method of using in combination of the silicone material, since the silicone sealing material has the moisture curing property but is in the form of a paste at normal temperature, it takes several hours to several days to cure the sealing material after coating in an assembling state. Therefore, slight vibration in the uncured condition causes shift occurrence between the panel and the frame at the time of their handling and delivering.

Thus, the present inventors have intensively studied to solve the problem of the troublesome assembling of the above frame structure and distortion of the outside dimension as well as problems of quality and production process due to the butyl rubber sealing material in the above improved sealing method. As a result, the present inventors have found that, when using 1) a frame having a projecting plates for supporting the surface opposed to the light-receiving surface of the light-transmission plate, 2) the projecting plates being provided over the periphery of the end portion of the solar battery panel, 3) the frame permitting the light-receiving surface of the light-transmission plate to be in an opened state, and 4) using a moisture curing hot-melt type adhesive containing, as a main component, an urethane polymer obtained by reacting a polyhydroxy compound with an excess amount of a polyisocyante compound as an adhesive for fixing the solar battery panel to the frame, there can be produced a solar battery module wherein the above problems have entirely been improved. The solar battery module and the process for producing the same was filed (Japanese Patent Application No. 6-155623).

DISCLOSURE OF THE INVENTION

Thus, a further study about the fixing adhesive to be used was made. As a result, the present inventors have found that, a moisture curing hot-melt type adhesive containing, as a main component, a polymer having at least two hydrolytic silyl groups in one molecule, shows a good adhesion and an improvement in physical properties such as weathering resistance and durability of the cured article without a primer for improving the adhesion between the solar battery panel and the frame. Thus, the present invention has been accomplished.

That is, according to a first aspect of the present invention, there is provided a solar battery panel module which comprises: a solar battery panel comprising a light-transmission panel and a solar battery element, the solar battery element being provided on the surface opposed to the light-receiving surface of the light-transmission plate; and a frame for mounting said solar battery panel provided with a plunge or projecting plate therefrom for supporting the periphery of the end portion of the solar battery panel at a surface side opposed to the light-receiving surface of the light-transmission plate in a manner to permit the light-receiving surface of the light-transmission plate to be in an opened state, wherein the solar battery panel is fixed onto the projecting plate of the frame by a moisture curing hot-melt type adhesive containing, as a main component, a polymer having at least two hydrolytic silyl groups in one molecule.

According to a second aspect of the present invention, there is provided a method of assembling a solar battery module, which comprises: melt-applying a moisture curing hot-melt type adhesive containing, as a main component, a polymer having at least two hydrolytic silyl groups in one molecule on a projecting plate of a frame; mounting a solar battery panel on a melt-applied projecting plate of the frame; solidifying the hot-melt type adhesive with cooling to achieve an initial adhesive strength, and further completely curing the adhesive by moisture to fix a solar battery panel onto the projecting plate of the frame.

The polymer having at least two hydrolytic silyl groups in one molecule as the main component polymer of the moisture curing hot-melt type adhesive used in the present invention is classified roughly into two kinds. The contents are as follows.

(A) Polymer having at least two hydroxyl, mercapto, or mono-substituted or non-substituted amino groups as a functional group capable of reacting with an isocyanate group, wherein at least two hydrolytic silyl groups are introduced into one molecule via a urethane or a urea bond with the functional group.

The polymer (A) can be produced by using a polymer (having a molecular weight of normally from 1000 to 50000, preferably from 3000 to 30000) having at least two functional groups capable of reacting with an isocyanate group, i.e. hydroxyl group (OH), mercapto group (SH), a mono-substituted amino group or non-substituted amino group (NHR in which R represents H, an alkyl group or a phenyl group) as a starting polymer, reacting the functional group of the starting polymer (e.g. OH-containing polymer, SH-containing polymer and NHR-containing polymer) with an excess amount of a diisocyanate compound (e.g. tolylene diisocyanate, 4,4'-diphenylmethane diisocyanate, xylylene diisocyanate, naphthylene diisocyanate, paraphenylene diisocyanate, tetramethylxylylene diisocyanate, hexamethylene diisocyanate, dicyclohexylmethane diisocyanate, isopherone diisocyanate, lysine diisocyanate, hydrogenated xylylene diisocyanate, cyclohexyl diisocyanate, tolidine diisocyanate, etc.) to form a free isocyanate group (NCO), and then reacting said NCO with a nearly equivalent or excess amount of an alkoxysilane (e.g. γ-aminopropyltrimethoxysilane, γ-aminopropyltriethoxysilane, γ-aminopropylmethyldimethoxysilane, N-aminoethylaminopropyltrimethoxysilane, N-aminoethylaminopropylmethyldimethoxysilane, 1,3-diaminoisopropyltrimethoxysilane, γ-N-phenylaminopropyltrimethoxysilane, bis(trimethoxysilylpropyl)amine, γ-ureidopropyltrimethoxysilane, γ-hydroxypropyltrimethoxysilane, γ-mercaptopropyltrimethoxysilane, γ-mercaptopropylmethyldimethoxysilane, etc.) having a functional group capable of reacting with NCO to introduce a hydrolytic silyl group, or by reacting a functional group of the starting polymer with a nearly equivalent or excess amount of an isocyanate alkoxysilane (e.g. isocyanate propyltriethoxysilane, isocyanate propyltrimethoxysilane, isocyanate propylmethyldimethoxysilane, isocyanate trimethoxysilane, diisocyanate dimethoxysilane, etc.) to introduce a hydrolytic silyl group.

Among the above starting polymers, examples of the OH-containing polymer are polyether polyols obtained by addition polymerization of water or a polyhydric alcohol (e.g. ethylene glycol, propylene glycol, glycerin, trimethylolpropane, pentaerythritol, sorbitol, sucrose, etc.) and propylene oxide or propylene oxide and the other alkylene oxide (e.g. ethylene oxide, etc.); polyalkylene glycols such as polyethylene glycol (PEG), polypropylene glycol (PPG), ethylene glycol, butylene glycol, hexylene glycol, etc.; polytetramethylene ether glycols; polycaprolactone polyols; polyester polyols such as polyethylene adipate, etc.; polybutadiene polyols and hydrogenated products thereof; and OH-containing higher fatty acid esters such as castor oil.

Examples of the SH-group containing liquid polymer include a liquid polysulfide polymers which is represented by the formula:

$$HS-(R_1-S\cdot S)_n-R_1-SH$$

(wherein $R_1$ represents $-C_2H_4-$, $-C_3H_6-$, $-C_2H_4-O-C_2H_4-$, $C_2H_4-O-C_2H_4-O-C_2H_4$, $-C_3H_6-O-C_3H_6-O-C_3H_6-$ or 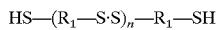$-C_2H_4-O-(C_2H_4-O)_{1-30}-$ $C_2H_4$; and n represents an integer of 2 to 50) and which has a transparent amber color and is liquid or viscous liquid at normal temperature. Specific examples thereof include those represented by the formula:

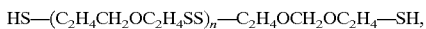
$HS-(C_2H_4CH_2OC_2H_4SS)_n-C_2H_4OCH_2OC_2H_4-SH$, which are manufactured by Toray Thiocol Co., Ltd. under the trade name of "Thiokol LP-2", "Thiokol LP-12" and "Thiokol 32" (average molecular weight: 4000) and those (average molecular weight: 7500) manufactured by Toray Thiokol Co., Ltd. under the trade name of "Thiokol LP-31".

As the NHR-containing polymer, for example, those manufactured by TEXCO Co. under the trade name of "JEFFAMINE D-230", "JEFFAMINE D-400", JEFFAMINE T403" and "JEFFAMINE EDR-148" are commercially available (each structure of these commercially available products are represented by $H_2N-PPG-NH_2$).

(B) Polymer having at least two alkoxysilyl groups in one molecule obtained by radical polymerization of at least one acrylate monomer, at least one selected from the group consisting of vinylalkoxysilane and (meth) aryloxyalkoxysilane and at least one mercaptoalkoxysilane as a chain transfer agent.

The polymer (B) can be produced by performing radical copolymerization of at least one acrylate monomer (e.g. straight-chain, branched or alicyclic alkyl esters having 2 to 8 carbon atoms, such as ethyl acrylate, propyl acrylate, n-butyl acrylate, isobutyl acrylate, amyl acrylate, hexyl acrylate, 2-ethylhexyl acrylate, cyclohexyl acrylate, n-octyl acrylate, etc. are preferable) and at least one selected from the group consisting of vinylalkoxysilane (e.g. vinyltrimethoxysilane, vinylmethyldimethoxysilane, vinyltriethoxysilane, vinyldimethylmethoxysilane, vinyltris (β-methoxyethoxy)silane, etc.) and (meth) acryloxyalkoxysilane (e.g. γ-methacryloxypropyltrimethoxysilane, γ-methacryloxypropylmethyldimethoxysilane, γ-acryloxypropyltrimethoxysilane, etc.) in the presence of at least one mercaptoalkoxysilane (e.g. γ-mercaptopropylmethyldimethoxysilane, γ-mercaptopropyltrimethoxysilane, etc.) as a chain transfer agent using a radical polymerization initiator (e.g. α,α'-azobisisobutyronitrile, α,α'-azobisisovaleronitrile, benzoyl peroxide, methyl ethyl ketone peroxide, etc.) according to a known polymerization process such as bulk polymerization, solution polymerization, etc., or performing redox polymerization using a redox catalyst (e.g. combination of a transition metal salt, amine, etc. and a peroxide radical polymerization initiator).

In this case, the mercaptoalkoxysilane (chain transfer agent) may be used in an amount within the range from 0.001 to 0.05 mol (particularly from 0.002 to 0.03 mol) per mol of the acrylate monomer, and the vinylalkoxysilane and/or (meth)acryloxyalkoxysilane may be used in an amount within the range from 0.4 to 2.0 per mol of the mercaptoalkoxysilane.

Furthermore, in place of a part of the above acrylate monomer, there may be normally used in combination with other monomers capable of copolymerizing with the acrylate monomer, for example, methacrylates (e.g. methyl methacrylate, ethyl methacrylate, n-butyl methacrylate, isobutyl methacrylate, 2-ethylhexyl methacrylate, lauryl methacrylate, tridecyl methacrylate, benzyl methacrylate, cyclohexyl methacrylate, tetrahydrofurfuryl methacrylate, 2-hydroxyethyl methacrylate, 2-hydroxypropyl methacrylate, glycidyl methacrylate, 2-methoxyethyl methacrylate, 2-ethoxyethyl methacrylate, dimethylaminoethyl methacrylate, etc.), acrylates other than the above acrylates (methyl acrylate, glycidyl acrylate, 2-hydroxyethyl acrylate, 2-hydroxypropyl acrylate, dimethylaminoethyl acrylate, etc.), vinylmethyldichlorosilane, γ-methacryloxypropylmethyldichlorosilane, γ-acryloxypropyltrichlorosilane, mercapto group-containing acrylic monomer [equimolar reaction product of hydroxyethyl (meth)acrylate and thioglycolic acid], isocyante group-containing acrylic monomer [e.g. methacryloyl isocyanate, acryloylethyl isocyanate, etc.] and (meth)acrylic acid, vinyl acetate, vinyl propionate, vinyl versatate [manufactured by Shell Kagaku Co., Ltd. under the trade name of "Veoba"], vinyl chloride, vinyl alcohol, acrylonitrile, styrene, amide (meth)acrylate, amide N-methylolacrylate, N,N-dimethyl (meth)allylamine, vinylpyridine, maleic anhydride, vinylpyrrolidone, etc. in an amount within the range from 20 to 50% by mol.

The moisture curing hot-melt type adhesive (hereinafter referred to as moisture curing HMA) used in the present invention contains the above polymer (A) or (B) as a main component, and is produced by optionally blending thermoplastic polymers, fillers and plasticizers to the polymer (A) or (B) and further blending suitable additives such as solvents for adjusting the viscosity, curing catalysts, tackifiers, softeners, thixotropic agents (e.g. benton, silicic anhydride, silicic acid derivative, urea derivative, etc.), dyes/pigments, antioxidants, ultraviolet absorbers, flame retardants, silane compounds, dehydrating agents and the like. The moisture curing hot-melt type adhesive is in the form of a solid or semi-solid at normal temperature, and is normally converted into the form of flowable paste or liquid by heating to 70 to 100° C. When cooling to normal temperature after melting with heating, the adhesive is solidified to achieve an initial adhesive strength and reaches the perfect cured state by moisture curing in air, thereby making it possible to form a cured article which is superior in adhesion and is extremely superior in durability such as weathering resistance, heat resistance, etc.

The above thermoplastic polymer contributes to an improvement in cohesive force of the moisture curing HMA and a development of the initial adhesive strength, and improves low-temperature elasticity by reducing the glass transition temperature of the moisture curing HMA. Also, the thermoplastic polymer can reduce a change in physical properties from low temperature to high temperature and contributes to cost reduction of the moisture curing HMA. Suitable examples of the thermoplastic polymer include those (melting point: normally 70 to 100° C.) obtained by reacting a polyfunctional ring-containing active hydrogen-containing compound (e.g. bisphenol resin, terpene resin, coumarone resin, xylene resin, rosin ester resin, styrene resin, phenol resin, terpene phenol resin, rosin resin, polyester resin, etc., having a molecular weight of 400 to 2000) and diols (e.g. ethylene glycol, 1,4-butanediol, 1,6-hexanediol, 1,8-octanediol, polycarbonate diol, polytetramethylene glycol, hydrogenated polybutanediol, polyacryldiol, polyoxyalkylene diol, polyoxyalkelene-added bisphenol, etc.) or triols (e.g. trimethylolpropane, glycerin, triethylene triol, polyoxyalkylene triol, etc.) with an excess amount or equivalent of a polyisocyanate compound [e.g. 2,4- or 2,6-tolylene diisocyanate, 4,4'-diphenylmethane diisocyanate (MDI), 1,3- or 1,4-xylylene diisocyanate, 1,5-naphthalene diisocyanate, isopherone diisocyanate, hexamethylene diisocyante, tetramethylene diisocyanate, dimethyldiphenylmethane diisocyanate, cyclohexylmethane diisocyanate, p-phenylene diisocyanate, or trimethylolpropane adducts of these polyisocyanates, or polyisocyanate polymers, among them, MDI is particularly preferable]. For example, they are commercially available from Toyo Kagaku Kenkyusho Co., Ltd. under the trade name of "thermoplastic resin Toyo Ace U-B".

Regarding such a suitable thermoplastic polymer, an urethane bond and a cyclic compound are introduced into the molecule so that thermoplasticity can be obtained by forming a molar cohesive force. Besides, the compatibility with the polymer (A) as the main component is improved by polarity of the cyclic compound and urethane bond. In addition to these thermoplastic polymers, there can be used other thermoplastic polymers such as polyurethane resin, polyester resin, polyolefin resin, polyacrylic resin, ethylene-vinyl acetate copolymer, styrene resin, polyvinyl chloride resin, polyamide resin, rubbers and the like. Among them, an ethylene-vinyl acetate copolymer is particularly preferable. In case of the polymer (B) as the main component, the thermoplastic polymer may not be used in combination if the polymerization component and polymerization degree are adjusted.

Examples of the above filler include silicic acid derivative, talc, metal powder, potassium carbonate, calcium carbonate, clay, carbon black and the like.

Examples of the above plasticizer include dibutyl phthalate, dioctyl phthalate, dicyclohexyl phthalate, diisooctyl phthalate, diisodecyl phthalate, dibenzyl phthalate, butylbenzyl phthalate, trioctyl phosphate, epoxy plasticizer, toluene-sulfoamide, chloroparaffin, adipate, castor oil and the like.

In the moisture curing HMA composed of the above formulation components, the content of the polymer (A) or (B) as the main component is normally selected within the range from 20 to 60% by weight, preferably from 30 to 50% by weight. The content of the thermoplastic polymer, filler, plasticizer and the total amount of the above additives are selected within the range of not more than 50% by weight, not more than 50% by weight, not more than 20% by weight and not more than 10% by weight, respectively.

When the content of the polymer (A) or (B) as the main component is less than 20% by weight, the elongation as basic physical properties in case of being cold is insufficient and the hardness is too high. On the other hand, when the content exceeds 60%, the operation property is liable to become inferior.

When the content of the thermoplastic polymer exceeds 50%, the physical properties in case of being cold are liable to be unsatisfied.

When the content of the filler exceeds 50%, the viscosity of the moisture curing HMA at the time of melting with heating is too high and the adhesion and physical properties are liable to become inferior.

When the content of the plasticizer exceeds 20%, the adhesion and initial strength are liable to become inferior.

The above moisture curing HMA can be prepared by the following procedure.

First, the thermoplastic polymer is molten and then charged in a nitrogen-replaceable vessel heated at about the melting temperature. The polymer (A) or (B) as the main component is added under a nitrogen atmosphere and a filler and a plasticizer are added with stirring, followed by defoaming with stirring under vacuum. A solvent for adjusting the viscosity and a curing catalyst are added as the additive, followed by vacuum defoaming with stirring to obtain a moisture curing HMA.

According to another process, the moisture curing HMA can also be prepared by the procedure of previously charging a plasticizer in a reaction vessel, producing the polymer (A)

or (B) as the main component and adding a thermoplastic polymer, a filler and an additive in order.

BRIEF DESCRIPTION OF THE DRAWINGS

FIGS. 1A and 1B show one embodiment of a solar battery module of the present invention, wherein FIG. 1A is a plan view illustrating the solar battery module and FIG. 1B is a sectional view taken along lines A—A of FIG. 1A.

FIG. 3 is a flow chart schematically showing an assembling line of the process of the present invention.

BEST MODE FOR CARRYING OUT THE INVENTION

The solar battery module of the present invention and process for producing the same will be described in detail with reference to the accompanying drawings, hereinafter.

Figure 1A:
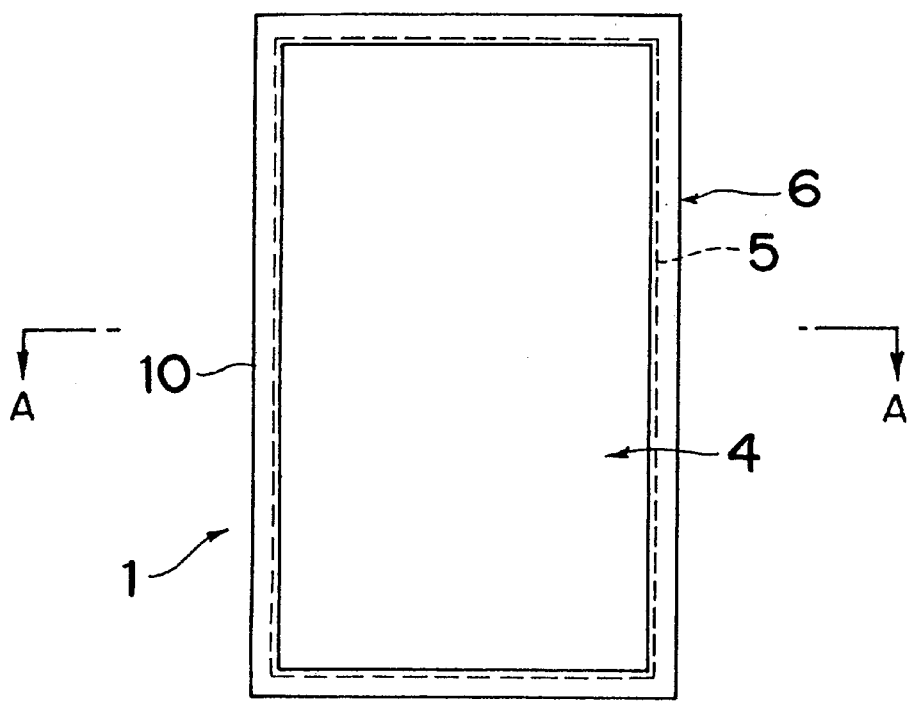
Figure 1B:
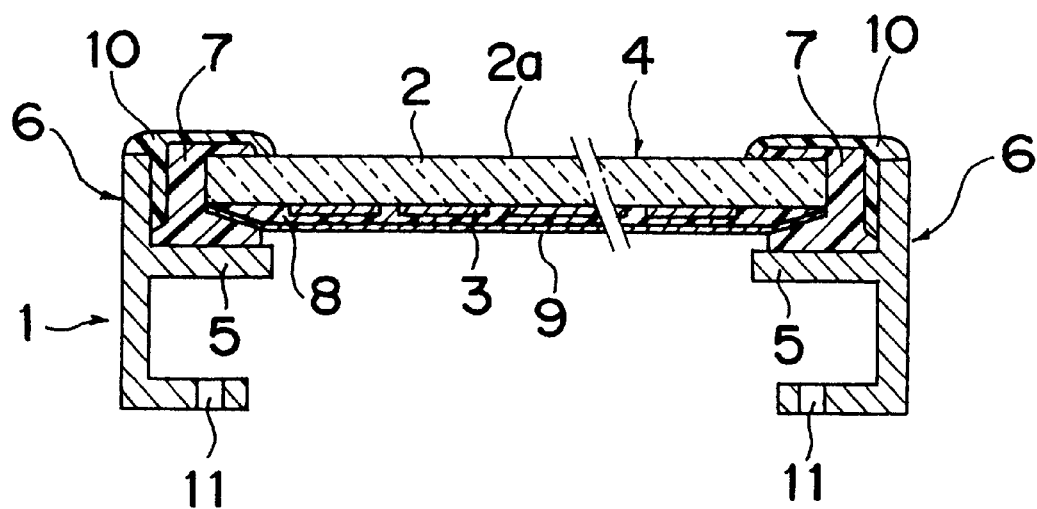

The solar battery module 1 of the present invention shown in FIGS. 1A and 1B is composed of a solar battery panel 4 comprising a light-transmission panel 2 and a solar battery element 3, the solar battery element being provided on the surface which is opposed to the light-receiving surface 2a of the light-transmission plate, and a frame 6 having a projecting plate 5 for supporting the surface which is opposed to the light-receiving surface 2a of the light-transmission plate 2, provided over the periphery of the end portion of the solar battery panel, wherein the solar battery panel 4 is fixed onto the projecting plate 5 of the frame 6 using a moisture curing HMA 7 containing, as a main component, the above polymer (A) or (B).

Figure 2:
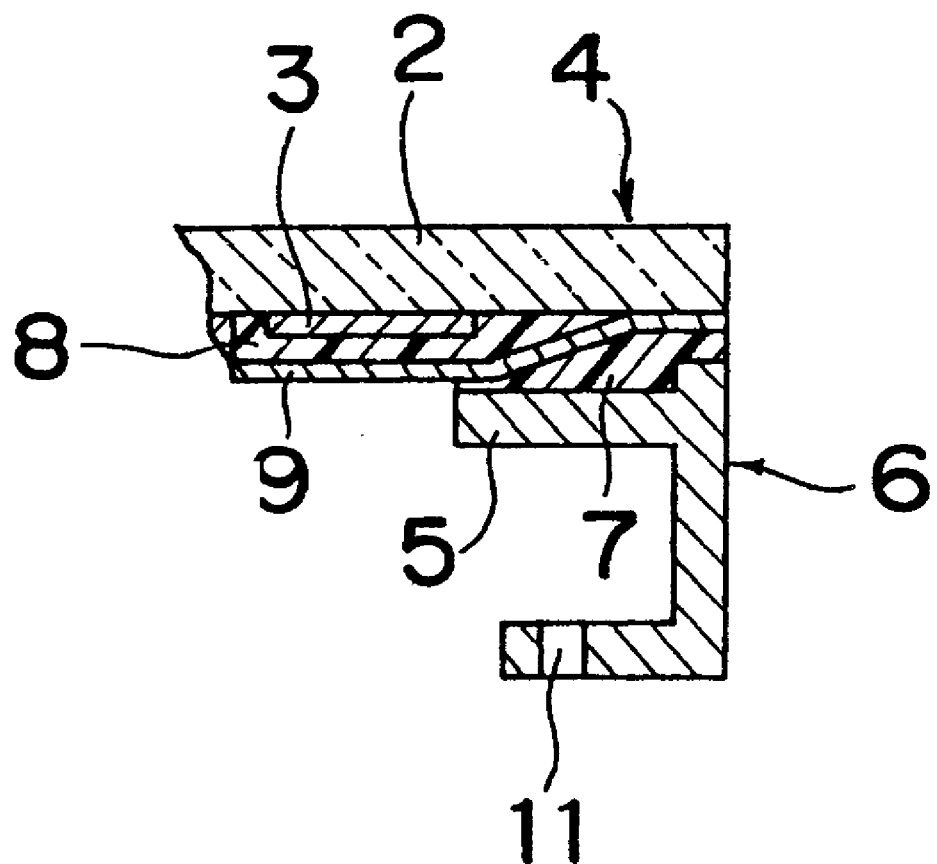
FIG. 2 is a sectional view showing a part of another embodiment of a solar battery module of the present invention.

In the solar battery panel 4, a transparent plate glass is used as the light-transmission plate 2 and a plurality of crystal solar battery elements 3 provided on the surface, which is opposed to the light-receiving surface 2a, are sealed by using a sealing material 8 of an ethylene-vinyl acetate copolymer (EVA) and, furthermore, the back side is covered with a back sheet 9 prepared by sandwiching an aluminum foil with polyvinyl fluoride (PVF). The respective solar battery elements 3 are connected with each other by the circuit in the sealing material 8 and further connected with an output terminal (not shown) in a terminal box (not shown) provided on the back sheet 9, thereby making it possible to utilize a generated output. Furthermore, in order to improve a waterproof function, the exposed portion of the moisture curing HMA 7 at the at light-receiving side can be optionally covered with a molding member 10. This molding member 10 is provided before solidifying the moisture curing HMA 7 with cooling, and the solar battery panel 7, frame 6 and molding member 10 are and fixed each other by solidification with cooling and moisture curing of the moisture curing HMA 7. The molding member 10 is used for improving the appearance and the embodiment in case of eliminating the mole 10 is shown in FIG. 2.

Furthermore, although a crystal solar battery element was used as the above solar battery element 3, there can also be used such a type produced by immediately providing a solar battery element made of an amorphous silicon thin-film semiconductor on the surface which is opposed to the light-receiving surface 2a of the light-transmission plate 2, and coating an epoxy resin on the solar battery element to form a protective layer. In such way, the structure of the solar battery panel is not specifically limited in the present invention.

On the other hand, the above frame 6 may be a structure formed integrally by casting or injection molding (e.g. injection molded article of aluminum die cast, engineering plastic, etc.) or those assembled by using four frames each having a predetermined shape. As shown in the figure, a solar battery array can be constructed by providing a hole 11 and fixing to a frame for arranging an array (not shown) provided outside.

The process for producing the solar battery module 1 of the present invention comprises the steps of melt-applying the moisture curing HMA on a projecting plate 5 of the frame 6, placing a solar battery panel 4 on a melt-applied projecting plate of the frame 6, solidifying the hot-melt type HMA 7 with cooling to achieve an initial adhesive strength, and completely curing the HMA by moisture to fix the solar battery panel 4 onto the projecting plate 5 of the frame 6. The whole process will be described with reference to the assembling line of the solar battery module schematically shown in FIG. 3.

Before melt-applying of the moisture curing HMA 7 onto the projecting plate 5, optionally a suitable primer can be previously coated on the adhesive surface of the solar battery panel 4 and/or projecting plate 5 (normally on the adhesive surface of the solar battery panel 4) to further enhance the adhesive force, if necessary, but this treatment is not required necessarily. Examples of the primer (normally solvent solution having a solid content of 3 to 20%) include those prepared by dissolving a mixture of one or more kinds of a polyisocyanate compound, a silane coupling agent and a titanate coupling agent in an organic solvent with mixing, and optionally adding a film forming substance such as acrylic resin, polyester resin, chlorinated polymer, etc., and the moisture curing HMA may be melt-applied after the primer may be applied and dried. When this melt-applying is automatically performed by using a robot, a hot-melt applicator can be used.

The assembling line of FIG. 3 is composed of a line 21 for frame and a line 23 for solar battery panel, and a solar battery panel 4 is firstly taken from a pallet for panel 25 and then fed to a frame introducing station (i) on the line 23 for solar battery panel.

When the primer is coated, a primer 27 (e.g. primer #435-40 manufactured by Sunstar Giken Co., Ltd.) is coated on the projecting plate surface of the solar battery panel 4 at a primer coating station (ii), followed by standing for about 1 minute as a drying time of the primer 27 at an open station (iii). Then, the resultant is transferred to a carrying-out station (iv) and is carried out from the carrying-out station (iv) to a panel laminating station (3) of the line 21 for frame.

When primer coating is not performed, the solar battery panel 4 is taken from the pallet for panel 25 and then carried out to the panel laminating station (3) as it is.

On the other hand, in the line 21 for frame, an assembled frame 6 is introduced in a frame introducing station (1). In advance of this frame introducing station, a frame producing station (not shown) for producing the frame 6 may be provided.

Then, in an adhesive coating station (2), those prepared by melting the moisture curing HMA 7 containing, as a main component, the polymer (A) or (B) with heating at 70 to 100° C. are applied on the projecting plate 5 of the frame 6 (the peripheral portion in the frame 6 may also be included). Before this melt-applying, the primer may be previously coated on the projecting plate 5 in the same manner as that performed in the primer coating station (ii).

Subsequently, in the panel laminating station (3), the primer-treated projecting plate of solar battery panel from the carrying-out station (iv) or primer-untreated projecting plate of solar battery panel 4 taken from the pallet for panel 25 is placed on the projecting plate. Although the frame 6 is assembled based on the peripheral shape of the solar battery panel 4, the projecting plate 5 has a structure like a shelf portion protruded inside the frame 6 so that lamination of the solar battery panel 4 can be simply performed.

Finally, the exposed portion of the moisture curing HMA 7 is optionally covered by fixing a molding member 10 in the molding member fixing station (4). By the above procedure, a desired solar battery module 1 is completed.

Regarding the moisture curing HMA used in such a process, the viscosity rapidly increases by cooling after melt-applying to lose the fluidity. Although it depends on the applying weight, the moisture curing HMA is solidified within several seconds to several minutes to achieve the initial adhesive strength (at this stage, perfect curing is not obtained, however, handling in the following inspection step is satisfactory because the HMA has the strength enough to prevent slip of the frame even if an outer force such as transfer, stacking, packaging, etc. is applied). Furthermore, since the HMA has the reactivity with moisture in air (moisture curing property), rubber elasticity having higher hardness is obtained by the following proceeding of the reaction.

The carrying-out operation of the solar battery panel 4 and frame 6 in the assembling line as well as coating operation of the primer 27 and moisture curing HMA 7 may be performed by using a suitable robot 29, 31. As the robot, a general six-shaft articulated robot can be used.

With reference to the following Production Examples (Examples) of the moisture curing HMA used in the present invention and Comparative Examples, an adhesion test will be evaluated.

EXAMPLE 1

(1) Production of Polymer (A)

105 g of PPG having an average molecular weight of 10000 [manufactured by Asahi Garasu Co., Ltd., PML-4010] is charged in a 300 ml separable flask. After heating to 80° C., 3.35 g of tolylene diisocyanate (OH/NCO=1/2.1) is added under a nitrogen atmosphere and the mixture is reacted at the same temperature for 24 hours. After air-cooling to 40° C., 3.32 g of γ-aminopropyltriethoxysilane [manufactured by Shinetsu Silicone Co., Ltd., KBE-903] is added. Then, a hydrolytic silyl group is introduced by reacting with stirring to obtain a polymer (A).

(2) Preparation of Moisture Curing HMA 100 g of the polymer (A) obtained in the above item (1) is charged in a stirrer wherein the atmosphere is replaced by nitrogen, and the temperature is set to 80° C. Then, 30 g of a thermoplastic polymer [manufactured by Toyo Kagaku Kenkyusho Co., Ltd, Toyo Ace U-B] molten at 90° C. for 3 hours is added and, after stirring at the same temperature for 20 minutes, 15 g of dicyclohexyl phthalate is charged. Then, previously dried carbon black (80 g) and calcium carbonate (25 g) are added and, after stirring under vacuum of 10 mmHg, 8 g of γ-aminopropyltriethoxysilane, 15 g of xylene and a curing catalyst [0.3 g of a 1% xylene solution of dibutyltin dilaurate (DBTDL)] are added, followed by vacuum defoaming with stirring for 30 minutes to obtain a moisture curing HMA, which is taken in an aluminum cartridge and sealed.

EXAMPLE 2

(1) Production of Polymer (A)

After 105 g of PPG (PML-4010) manufactured by Asahi Garasu Co., Ltd is heated to 80° C., 3.7 g of isocyanate propylmethyldimethoxysilane [manufactured by Shinetsu Silicone Co., Ltd., KBM-9207] is added and the mixture was reacted for 24 hours to obtain a polymer (A).

(2) Preparation of Moisture Curing HMA

According to the same formulation and conditions as those described in Example 1 (2) except for using 100 g of the polymer (A) obtained in the above item (1), a moisture curing HMA is obtained.

EXAMPLE 3

(1) Production of Polymer (B)

n-butyl acrylate (0.5 mol), ethyl acrylate (50 g, 0.5 mol), γ-methacryloxypropylmethyldimethoxysilane (3.49 g, 0.015 mol) and γ-mercaptopropylmethyldimethoxysilane (0.72 g, 0.004 mol) are mixed. To the mixture, 0.3 g of α,α'-azobisisobutyronitrile (AIBN) and 60 g of dioctyl phthalate as the plasticizer are added, followed by mixing with stirring. A part (20 g) of this mixed solution is charged in a separable flask and slowly heated to 80° C. under a nitrogen atmosphere. While confirming that the polymerization starts and the temperature rises after several minutes, stirring and heating are continued. After 10 minutes, the remaining mixed solution is slowly added dropwise using a dropping funnel to perform the reaction. After the completion of the dropwise addition, heating is continued for about 30 minutes. To the reaction solution, AIBN (0.1 g) is added, followed by heating with stirring for about 1 hour, thereby completing the copolymerization reaction. The resulting polymer (B) was a colorless transparent and viscous liquid, and its average molecular weight determined by GPC was 32000.

(2) Preparation of Moisture Curing HMA

To 60 g of the polymer (B) obtained in the above item (1), 40 g of calcium carbonate and 10 g of titanium oxide are added. After previous mixing, the mixture is uniformly kneaded by using a three-roll mill and defoamed in a vacuum mixer for 5 minutes. Furthermore, DBTDL (0.1 g), n-octylamine (0.2 g), methanol (2 g) and γ-aminopropyltrimethoxysilane (3 g) are added, followed by mixing under vacuum to obtain a moisture curing HMA, which is taken in an aluminum cartridge and sealed.

EXAMPLE 4

(1) Production of Polymer (B)

n-ethylhexyl acrylate (147.2 g, 0.8 mol), methyl methacrylate (20 g, 0.2 mol), γ-methacryloxypropyltrimethoxysilane (4.98 g, 0.02 mol), γ-mercaptopropyltrimethoxysilane (0.49 g, 0.0025 mol) and dioctyl phthalate (85 g) are mixed. To the mixture, AIBN (0.3 g) is added, followed by mixing with stirring. According to the same manner as that described in Example 3 (1), the copolymerization reaction was performed to obtain a copolymer (B). The resulting polymer (B) was a colorless transparent and viscous liquid, and its average molecular weight determined by GPC was 56000.

(2) Preparation of Moisture Curing HMA

According to the same formulation and conditions as those described in Example 3 (2) except for using 100 g of the polymer (B) obtained in the above item (1), a moisture curing HMA is obtained.

COMPARATIVE EXAMPLE 1

A butyl rubber hot-melt adhesive of the following formulation is used.

| Components | % |
| --- | --- |
| Butyl rubber [manufactured by Exxon Co., butyl rubber 065] | 20 |
| Atactic polypropylene [manufactured by Mitsui Yuka Co., Ltd., APP B-3000] | 20 |
| Polybutene [manufactured by Nippon Sekiyu Co., Ltd., Polybutene HV-300] | 24 |
| Tackifier [manufactured by Arakawa Kagaku Co., Ltd., Tackifier Arcon P-115] | 32 |
| Polypropylene wax [manufactured by Mitsubishi Sekiyu Kagaku Co., Ltd., PP wax HMNP055] | 4 |

COMPARATIVE EXAMPLE 2

A commercially available one-component forming silicone sealing material [manufactured by Sunstar Giken Co., Ltd., Penguin Seal #2505] is used.

of the polymer (A), a moisture curing HMA is obtained.

Adhesion Test

Using adhesives of Example 1 to 4 and Comparative Examples 1 to 3, each adhesive is melt-applied at 60 to 100° C. on the adhesive portion (width: 3 mm) of two untreated test steel plates (12.5 mm×25 mm) and, after laminating both steel plates, the resulting laminate is subjected to the following tests. The results are shown in Table 1 below.

Initial adhesive strength: After standing at 20° C., 65% RH for 10 minutes, a shear strength is measured at a stress rate of 50 mm/minute.

Dry adhesive strength: After standing at 20° C., 65% RH for 7 days, a shear strength is measured at a stress rate of 50 mm/minute.

Thermal creep resistance: After standing at 20° C., 65% RH for 7 days, a weight of 500 g is suspended at one end of a test piece, followed by further standing at 90° C. for 48 hours. Then, it is observed whether the test piece dropped or not.

Weathering resistance (W/O): An adhesive is coated on a glass plate in the form of beads and the surface of the adhesive is exposed to a weatherometer. Then, it is observed whether a crack occurs on the surface of the adhesive or not.

TABLE 1

| | Example No. | | | | Comparative Example No. | | |
| --- | --- | --- | --- | --- | --- | --- | --- |
| Test item | 1 | 2 | 3 | 4 | 1 | 2 | 3 |
| Initial adhesive strength (kg.f/cm$^2$) | 0.4 | 0.3 | 0.2 | 0.3 | 1.0 | impossible to measure | 0.3 |
| Dry adhesive strength (kg.f/cm$^2$) | 42.0 | 40.0 | 30 | 33 | 1.0 | 8.0 | 2.0 |
| Thermal creep resistance | No change | No change | No change | No change | Deteriorated | No change | No change |
| Weathering resistance | Crack occurs after 650 hrs. | Crack occurs after 600 hrs. | No crack occurs even after 1000 hrs. | No crack occurs even after 1000 hrs. | Crack occurs after 300 hrs. | No crack occurs even after 1000 hrs. | Crack occurs after 700 hrs. |

COMPARATIVE EXAMPLE 3

(1) Production of Urethane Prepolymer 100 g of polyoxypropylene ethylene triol [manufactured by Asahi Garasu Co., Ltd., X8805, trifunctional, EO content: 12%, OH value: 13.8] is charged in a reaction vessel wherein the atmosphere is replaced by nitrogen. Under a nitrogen atmosphere, 7.9 g of 4,4'-diphenylmethane diisocyanate (MDI) is added (NCO/OH=2.61) and, after the temperature is adjusted to 80±5° C., the mixture is reacted for 1 hour. Thereafter, 0.05 g of a 1% xylene solution of dibutyltin dilaurate (DBTDL) is added and the mixed solution is reacted at the same temperature for 20 hours to obtain an urethane prepolymer (free NCO content: 1.48%, viscosity: 24000 cps/80° C., 380000 cps/20° C.).

(2) Preparation of Moisture Curing HMA

According to the same formulation and conditions as those described in Example 1 (2) except for using the urethane prepolymer obtained in the above item (1) in place

INDUSTRIAL APPLICABILITY

According to the present invention of the above construction, by using a moisture curing HMA containing, as a main component, a polymer (A) or (B) having at least two hydrolytic silyl groups in one molecule in place of a previously developed moisture curing hot-melt type adhesive containing, as a main component, an urethane prepolymer in case of fixing a solar battery panel 4 onto a frame 6, the resulting solar battery module, the adhesion between the solar battery panel and frame is excellent and the resulting solar battery module can sufficiently satisfies high requirements for the durability, particularly weathering resistance in case of outside installation, etc. and can obtains excellent reliability of battery functions and quality. Furthermore, based on use of the frame 6 with a projecting plate 5 as well as achievement of an initial adhesive strength of the moisture curing HMA and strong moisture curing, a dimensional error at the time of assembling of the solar battery module and slip of the frame after assembling do not arise. In a production assembling line, the operation can be carried out, simply and rapidly.

What is claimed is:

1. A solar battery panel module which comprises:

a) a solar battery panel comprised of a light-transmission plate and a solar battery element, the solar battery element being provided on a surface of the solar battery panel opposed to a light-receiving surface of the light-transmission plate; and b) a frame for mounting said solar battery panel provided with a flange or projecting plate for supporting the periphery of an end portion of the solar battery panel at a surface side opposed to the light-receiving surface of the light-transmission plate in a manner to permit the light-receiving surface of the light-transmission plate to be in an opened state;

wherein, the solar battery panel is fixed onto the projecting plate of the frame by a moisture curing hot-melt type adhesive containing, as a main component, a polymer having at least two selected from the group consisting of hydroxyl, mercapto, mono-substituted amino, and non-substituted amino groups as a functional group capable of reacting with an isocyanate group, and wherein at least two hydrolytic silyl groups are introduced into one molecule via a urethane bond with the functional group.

2. A method of assembling a solar battery module, which comprises:

melt-applying a moisture curing hot-melt type adhesive containing, as a main component, a polymer on a projecting plate of a frame for mounting a solar battery element, said polymer having at least two selected from the group consisting of hydroxyl, mercapto, mono-substituted amino and non-substituted amino groups as a functional group capable of reacting with an isocyanate group, and further at least two hydrolytic silyl groups are introduced into one molecule via a urethane bond with the functional group: followed by mounting a solar battery panel on the projecting plate of the frame; and solidifying the moisture curing hot-melt type adhesive with cooling to achieve an initial adhesive strength, and further completely solidifying the adhesive by moisture curing to fix a solar battery panel onto the projecting plate of the frame.

* * * * *